(12) United States Patent
Kownacki et al.

(10) Patent No.: US 6,260,265 B1
(45) Date of Patent: Jul. 17, 2001

(54) CIRCUIT BOARD STIFFENER

(75) Inventors: Charles D. Kownacki, Erie, PA (US); Paul M. Deters, Manhattan Beach, CA (US)

(73) Assignee: Power Distribution Products, Torrance, CA (US)

( * ) Notice: Subject to any disclaimer, the term of this patent is extended or adjusted under 35 U.S.C. 154(b) by 0 days.

(21) Appl. No.: 09/552,277

(22) Filed: Apr. 19, 2000

Related U.S. Application Data

(63) Continuation-in-part of application No. 09/067,376, filed on Apr. 27, 1998, now Pat. No. 6,122,815.

(51) Int. Cl.⁷ ........................................ H05K 3/02
(52) U.S. Cl. .................. 29/846; 29/426.1; 29/525.03; 428/573; 174/135
(58) Field of Search .................... 29/846, 426.1, 29/525.03, 525.04; 174/255, 138.6, 135; 361/752; 428/573, 596

(56) References Cited

U.S. PATENT DOCUMENTS

| | | | |
|---|---|---|---|
| 3,936,925 | * | 2/1976 | Simms, Jr. ............................ 29/466 |
| 4,425,980 | * | 1/1984 | Miles ................................... 181/208 |
| 4,452,359 | * | 6/1984 | Koppensteiner ....................... 211/41 |
| 4,988,577 | * | 1/1991 | Jamieson .............................. 428/573 |
| 5,065,490 | * | 11/1991 | Wivagg et al. .................... 29/402.17 |
| 5,186,377 | * | 2/1993 | Rawson et al. ........................ 228/37 |
| 5,198,279 | * | 3/1993 | Beinhaur ................................ 428/99 |
| 5,727,304 | * | 3/1998 | Eybergen .......................... 29/525.04 |
| 5,958,566 | * | 9/1999 | McCutcheon ....................... 428/172 |

* cited by examiner

*Primary Examiner*—Lee Young
*Assistant Examiner*—Minh Trinh
(74) *Attorney, Agent, or Firm*—Richard K. Thomson

(57) ABSTRACT

A rigid bar of material is fastened to a circuit board to increase its stiffness. The bar is preferably a high modulus plastic such as liquid crystal polymer. Flexible fingers which surround a central opening are formed integrally with the bar and pop into throughbores in the circuit board. Each finger has at least one arcuate protrusion and, preferably several, which can engage the bottom of the circuit board. A rigid pin which may be made of steel is slid into the central opening and has an interference fit therewith to hold it in place to prevent flexible fingers from moving inwardly so the stiffener is held fast to the circuit board. In one embodiment, the stiffener has an I-beam cross section and arches enhancing the resistance to bending.

7 Claims, 3 Drawing Sheets

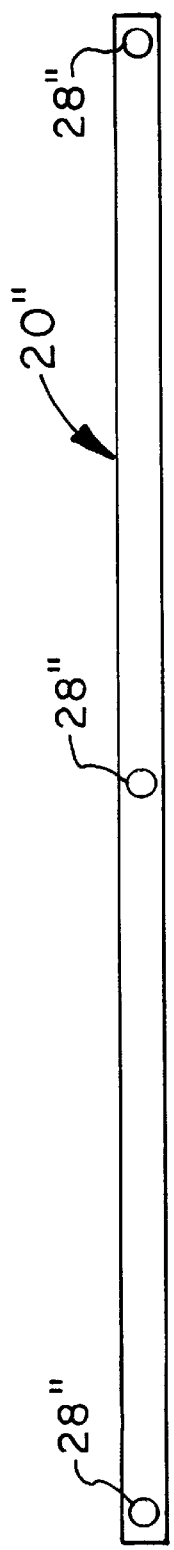
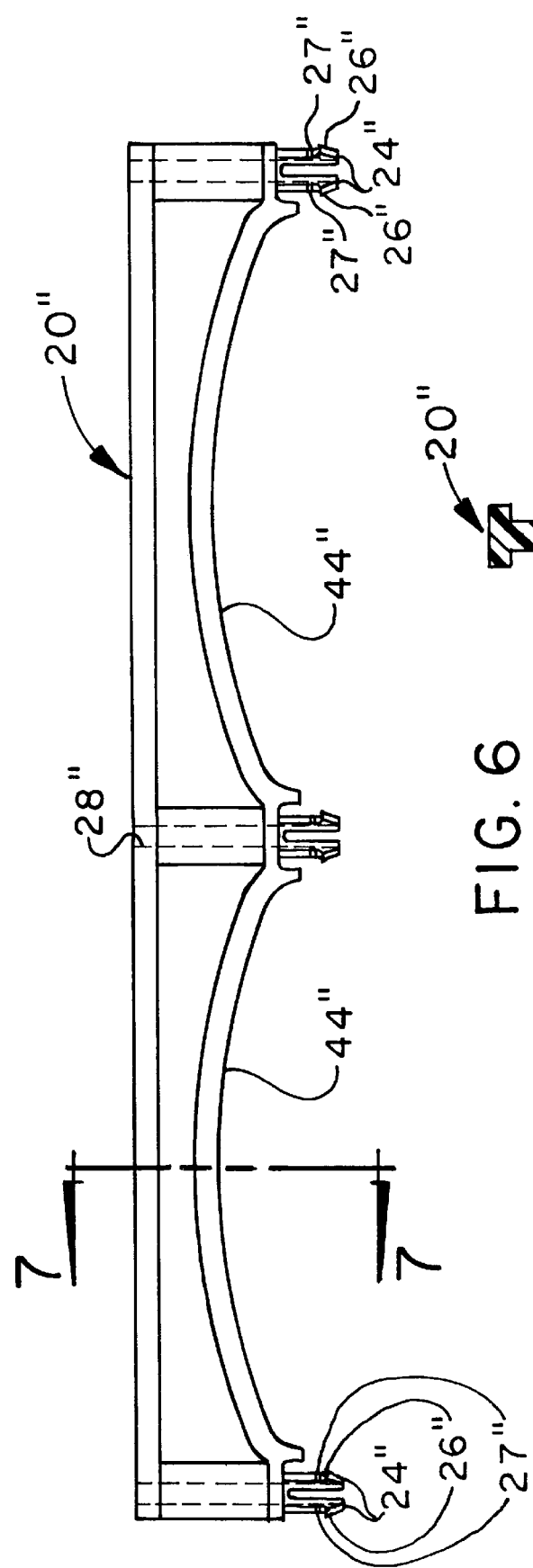
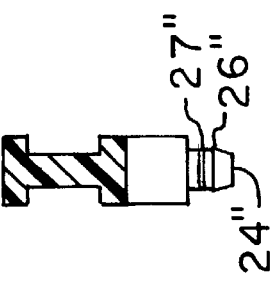

CIRCUIT BOARD STIFFENER

This application is a continuation-in-part of U.S. patent application Ser. No. 09/067,376 filed Apr. 27, 1998 now U.S. Pat. No. 6,122,815.

The present invention is directed to a stiffener for a circuit board. More particularly, the present invention is directed to an inexpensive board stiffener that can be quickly, easily and securely assembled to a circuit board and, in which access from only one side of the board is necessary.

BACKGROUND AND SUMMARY OF THE INVENTION

Circuit boards are typically rather thin and, therefore, flimsy. While this low profile is an advantage for meeting special limitations, it can be the source of problems arising from lack of to, structural stability. The thinness of the panel can make the board and its circuit connections vulnerable to shock and vibration that will damage or break the soldered connections. Further, the soldering process itself with its input of heat can result in board warpage that can make creation of proper connections difficult, if not impossible.

Various devices have been offered to stiffen a board. Many of these stiffeners are simply bolted to the board. Such fastening means requires access to both sides of the circuit board which is not always available. Even where such access is available, such attachment requires hole alignment and fastener insertion which can add time and, hence, expense to the assembly process. Many of the stiffeners are metallic so they are both electrically and thermally conductive. For certain applications, this can be undesirable. Some assembly techniques require deflection of some portion of an integral stiffener portion to create a fastener. Such mangling of the stiffener makes removal and replacement thereof, should such become desirable, extremely difficult and labor intensive and could result in damage to the board and/or its circuitry.

The present invention overcomes the difficulties with the prior art devices. A stiffener block of rigid material, preferably a high modulus plastic such as liquid crystal polymer, is fastened to one side of a circuit board using a plurality of integral flexible fasteners. Each flexible fastener includes a set of fingers which have arcuate protrusions formed thereon which can underlie a surface of the board and thereby attach the stiffener block thereto. Each of the sets of the fingers surround a cylindrical opening that provides a relief area into which the fingers can flex as they pass through the throughbores in the circuit board. Each of the flexible fingers preferably has a plurality of arcuate protrusions thereon so the stiffener can be used with a plurality of thicknesses of circuit boards. Once the flexible fingers have been inserted into the throughbores in the board, a rigid pin is inserted into the opening thereby maintaining the flexible fingers in an outwardly extended position where said arcuate protrusion underlies the circuit board. It is preferred that the pin be inserted into the opening in the same direction that the flexible fingers are inserted into the circuit board so that assembly can be effected from a single side of the board with access to the opposing side being unnecessary. Further, it is preferred that the pin be metallic and the integral fasteners of the stiffener of the present invention allow the pin to remain thermally and electrically isolated from the circuit board to which the stiffener is attached.

In one preferred embodiment, the stiffener has an I-beam cross section and arches are formed between pairs of flexible fingers. This structure significantly enhances the resistance to bending for the stiffener and the circuit board to which it is attached. An annular compression bump is formed on the flexible fingers which enhances the connection between the board and the stiffener and improves the stiffness imparted to the board.

Both the stiffener itself and the installation technique are inexpensive. Furthermore, the stiffener is very effective at minimizing deflection of the board at all temperatures the board is likely to experience. Lastly, the stiffener can be easily removed and replaced should, for some reason, the stiffener become damaged or otherwise need replacement.

Other features, advantages and characteristics of the present invention will become apparent after a reading of the following detailed description,

BRIEF DESCRIPTION OF THE DRAWINGS

The preferred embodiments of the present invention are described in conjunction with the following figures in which like items bear like reference numerals and, in which

FIG. 6 is a side view of a third embodiment of the present invention;

FIG. 7 is a cross-sectional end view as seen along line 7—7 in FIG. 6; and

FIG. 8 is a top view of the board stiffener of the third embodiment.

DETAILED DESCRIPTION OF THE PREFERRED EMBODIMENTS

Figure 1:
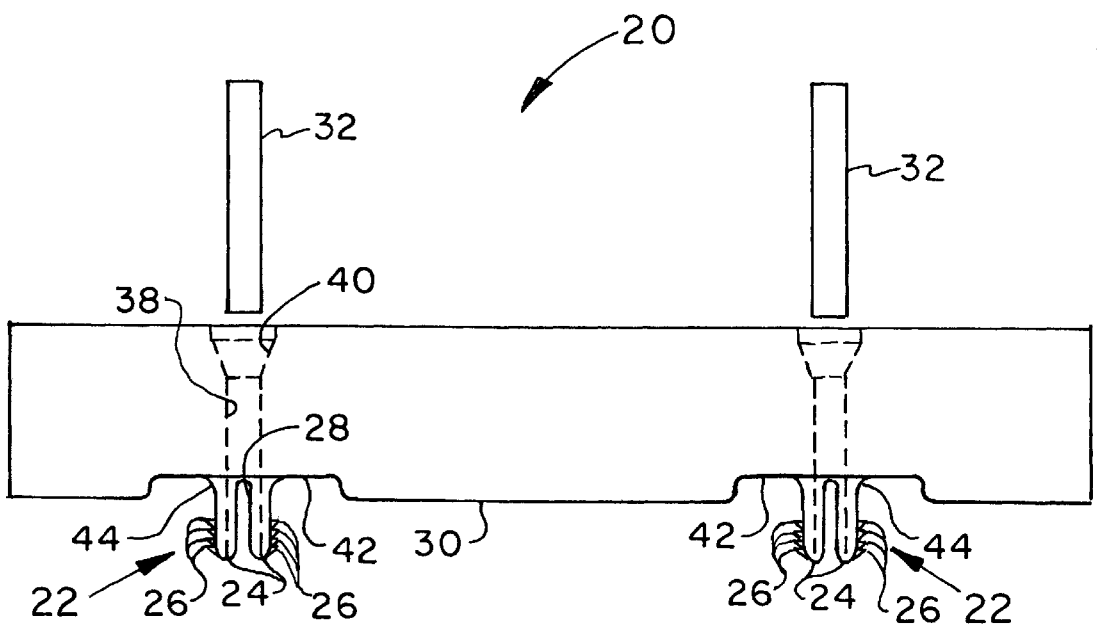
FIG. 1 is an exploded side view of the first embodiment of the board stiffener of the present invention.
Figure 3:
FIG. 3 is a partial side view in cross section of the first embodiment shown installed.
Figure 2:
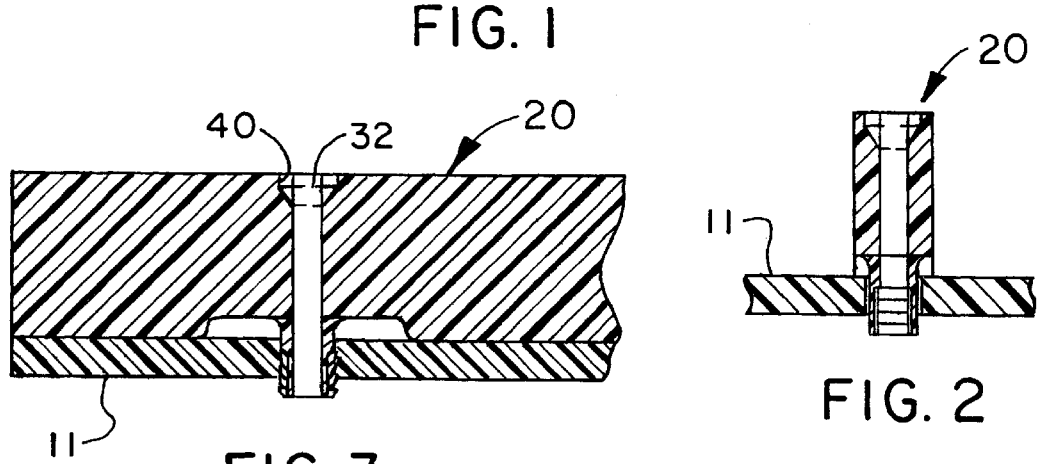
FIG. 2 is a cross-sectional end view of the first embodiment shown installed in a circuit board.

A first embodiment of the circuit board stiffener of the present invention is shown in FIGS. 1–3 generally at 20. Stiffener 20 comprises a generally rectangular block or bar of material. The block will preferably have a height at least twice its thickness and more preferably, on the order of three times its thickness. While other materials may be used, stiffener 20 is preferably made of a high modulus plastic and, most preferably, from liquid crystal polymer (LCP). Integral with an edge of block 20, are a plurality of flexible fingers 24. While two sets 22 are shown, three, four or more sets of fingers 24 could be used depending on the length of stiffener 20. Typically, stiffener 20 may range from 4 inches to 13 inches in length, or longer. Further, while the sets 22 are depicted as having two fingers 24 each, sets could comprise three or more fingers. A minimum of two sets 22 of fingers 24 is preferred for alignment purposes. However, a single set of fingers 24 could be used if one or more projections (not shown) from the edge of stiffener 20 were to be received in alignment recesses in board 11.

Each finger 24 has at least one arcuate protrusion 26. More preferably, each finger 24 has a plurality of arcuate protrusions 26 so that stiffener 20 can be used with a plurality of thicknesses of circuit boards 11. Typically, circuit boards 11 may have thicknesses between 0.093 and 0.125 inches.

By providing fingers 24 with a plurality of protrusions 26, a single design of board stiffener 20 can be used with several board thicknesses making it unnecessary to maintain inventories of various stiffener designs.

Flexible fingers 24 of each set 22 surround a central opening 28. Opening 28 provides a clearance space into which fingers 24 can flex from a first outwardly expanded position to a second contracted position as fingers 24 traverse throughbore 13 in board 11. When stiffener surface 30 is flush against board 11, the appropriate ate rotsion 26 will underlie board 11. Rigid pin 32 can then be inserted into central opening 28 to keep fingers 24 in the outwardly expanded position so that the appropriate protrusion 26 underlies board 11 and fingers 24 cannot be withdrawn from throughbore 13. Pins 32 will typically be pre-installed in second opening 38 that is in alignment with central opening 28. Pins 32 have a diameter that provides an interference fit with openings 28 and 38, and a length equal to the combined lengths of central (28) and second (38) openings. Hence, in their pre-installed position, a portion of pin 32 generally equal to the length of the central opening 38 (i.e., the length of flexible fingers 24) will extend above the upper edge of stiffener 20. To complete the assembly of the stiffener to the board 11 pin 32 is moved axially in openings 28, 38 to where rigid pin 32 lies behind flexible fingers 24 and prevents their inward movement so stiffener 20 remains attached to circuit board 11. Pin 32 remains thermally and electrically isolated from board 11.

Mouth portion 40 of second opening 38 is flared to facilitate insertion of pin 32 and, if necessary, removal thereof Flared mouth 40 is wide enough to permit the insertion of needle-nose pliers to permit removal of pin 32 from the upper surface, should the bottom surface be inaccessible.

Alternatively, a dowel can be inserted into the bottom of central opening 28 and pin 32 tapped back into second opening 38 permitting fingers 24 to be flexed inwardly and withdrawn from throughbore 13. A relief recess 42 surrounds each set 22 of flexible fingers 24 and provides a stress relief radius 44 at the point the fingers 24 meet the bottom of recess 42. This reduces the likelihood that a stress fracture will occur which could result in the fingers 24 losing their resiliency or breaking off Additional recesses or clearance apertures can be provided as a particular board design may require to accommodate various circuitry.

Tests were performed on stiffeners made in accordance with the present invention of the preferred material, glass filled LCP. The specimens were tested to failure at three temperatures: 72° F., 150° F., 300° F. The first specimen having a thickness of 0.123" and a height of 0.250" (i.e., a height more than double its thickness) had moduli of $0.998 \times 10^6$ psi $0.930 \times 10^6$ psi, and $0.895 \times 10^6$ psi at the temperatures specified. A second specimen having a thickness of 0.122" and a height of 0.375" (i.e., a height to thickness ratio exceeding 3), had moduli of $2.037 \times 10^6$ psi, $1.584 \times 10^6$ psi and $1.161 \times 10^6$ psi at those same temperatures. Calculations for 5", 8" and 13" long reinforcement bars having thicknesses of 0.125" and various heights to determine maximum deflection at the center of the bar showed the following.

| 5" Stiffener Bar Max. Deflection in Inches | | | |
|---|---|---|---|
| Length | 72° F. | 150° F. | 300° F. |
| .375 | .012 | .015 | .020 |
| .400 | .010 | .012 | .016 |
| .450 | .007 | .009 | .012 |
| .500 | .005 | .006 | .009 |

Similar calculations for an 8" stiffener bar are tabulated below.

| 8" Stiffener Bar Max. Deflection in Inches | | | |
|---|---|---|---|
| Length | 72° F. | 150° F. | 300° F. |
| .375 | .048 | .061 | .083 |
| .400 | .040 | .051 | .069 |
| .450 | .028 | .035 | .048 |
| .500 | .020 | .026 | .035 |

Finally, calculations for a 13" stiffener bar appear in the following table.

| 13" Stiffener Bar Max. Deflection in Inches | | | |
|---|---|---|---|
| Length | 72° F. | 150° F. | 300° F. |
| .375 | .204 | .262 | .357 |
| .400 | .170 | .218 | .298 |
| .450 | .118 | .151 | .207 |
| .500 | .086 | .111 | .151 |

These calculations should reasonably predict the behavior of the stiffener bar 20 alone. When fastened to the circuit board, actual deflections should be on the order of only half the calculated deflections, perhaps even less.

Figure 4:
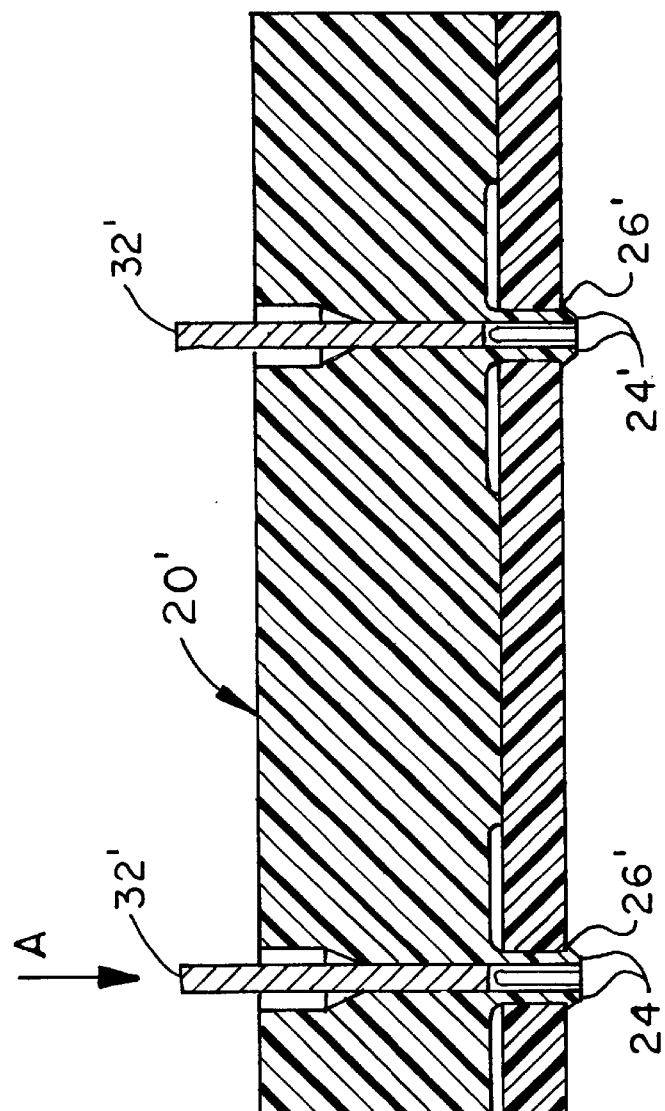
FIG. 4 is a cross-sectional side view of a second embodiment of the board stiffener of the present invention installed.
Figure 5:
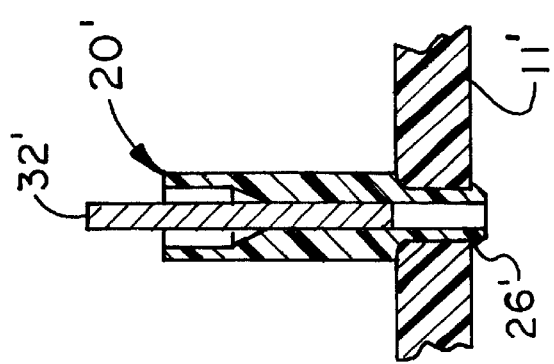
FIG. 5 is a cross-sectional end view of the second embodiment installed.

A second embodiment is shown in FIGS. 4 and 5 generally at 20'. In this embodiment, flexible fingers 24' have only a single protrusion 26'. As can be seen in FIG. 5, protrusion 26' can extend around the circumference of finger 24' than in the first embodiment. If a manufacturer has only a single thickness of board 11 with which it works, it may prefer a stiffener 20' made specifically for that thickness to one that can handle multiple thicknesses. Pins 32' are shown in their pre-installed positions in second openings 38'. Now that protrusion 26' underlies board 11', pins 32' can be slid axially in their openings in the direction of arrow A to back up flexible fingers 24' and prevent their retraction from throughbores 13' thereby locking stiffener 20' to board 11'.

A third embodiment of the stiffener of the present invention is shown in FIGS. 6–8 generally at 20". In this embodiment, the stiffener 20" is provided with a cross sectional shape of an I-beam. This structure significantly increases the resistance to bending of the stiffener 20" and the circuit board to which it is attached. The arches 44" formed between each pair of flexible fingers 24" provide additional structural rigidity. Fingers 24" are provided with a single annular protrusion 26" to underlie the board securing the stiffener 20" to the circuit board. Fingers 24" have an annular compression bump 27" which engage in the throughbores 13 in board 11 when pins are slid axially into openings 28". These compression bumps 27" enhance the securing of the stiffener 20" to, and help stiffen, the circuit board 11.

The present invention provides a circuit board stiffener 20 that is relatively inexpensive, highly effective and easy to install. In addition to the cost savings realizable through manufacturing and installation, the throughbores in the circuit board 11 need not be plated as is necessary with some other stiffeners to provide insulation since the flexible fingers 24 serve this purpose.

Various changes, alternatives and modifications will become apparent after a reading of the foregoing detailed description. For example, although only a single size of finger 24 has been shown for uniformly sized throughbores 13 in boards 11, it is considered within the scope of the invention to include several diameters of fingers 24 for insertion in different sized holes 13. It is intended that all such changes, alternatives and modifications as fall within the scope of the following claims be considered part of the present invention.

We claim:

1. A circuit board stiffener comprising:
   a) an elongated block of rigid material having a height at least twice its thickness and having an I-beam shaped cross section with an upper flange and a lower flange;
   b) a plurality of sets of integral flexible fasteners formed along an edge portion of said block of rigid material, each said flexible fastener having an interrupted annular configuration and including at least two flexible fingers, each said flexible finger having at least one arcuate protrusion formed there on, each said at least two flexible fingers surrounding a central opening, said central opening providing clearance space to permit said at least two flexible fingers to flex from a first outwardly expanded position to a second inwardly contracted position;
   c) at least one arch extending between a pair of said sets of said plurality of integral flexible fasteners for providing additional structural rigidity, said arch having said lower flange of said I-beam shape defining its upper limit;
   d) a rigid pin received in said central opening to maintain said fingers in said outwardly expanded position;
   whereby when said flexible fastening fingers are inserted into throughbores in the circuit board said fingers will flex inwardly into said central opening to said second position during insertion, returning to said first outwardly expanded position when insertion is complete allowing at least one of said arcuate protrusions on each of said fingers to underlie a bottom portion of said circuit board and, subsequently, said rigid pin winl be slid into said central opening to maintain said flexible fastening fingers in said first outwardly expanded position whereby said circuit board stiffener is secured to the circuit board.

2. The circuit board stiffener of claim 1 further comprising a compression bump formed on each of said at least two flexible fingers to enhance engagement with the circuit board.

3. A circuit board stiffener comprising:
   a) an elongated block of rigid material having a height at least twice its thickness and having an I-beam shaped cross section with an upper flange and a lower flange;
   b) a plurality of sets of integral flexible fasteners formed along an edge portion of said block of rigid material, each said set of flexible fasteners having an interrupted annular configuration and including at least two flexible fingers;
   c) at least one continuous arch extending between each pair of adjacent said sets of said plurality of integral flexible fasteners, said at least one continuous arch having said lower flange of said I-beam shape defining its upper limit;
   whereby said I-beam shape and said at least one continuous arch provide said circuit board stiffener with increased structural rigidity.

4. The circuit board stiffener of claim 3 further comprising at least one arcuate protrusion formed on each of said at least two flexible fingers.

5. The circuit board stiffener of claim 4 wherein each of said at least two flexible fingers surrounding a central opening, said central opening providing clearance space to permit said at least two flexible fingers to flex from a first outwardly expanded position to a second inwardly contracted position.

6. The circuit board stiffener of claim 5 further comprising a rigid pin received in said central opening to maintain said fingers in said outwardly expanded position; whereby when said flexible fastening fingers are inserted into throughbores in the circuit board said fingers will flex inwardly into said central opening to said second position during insertion, returning to said first outwardly expanded position when insertion is complete allowing at least one of said arcuate protrusions on each of said fingers to underlie a bottom portion of said circuit board and, subsequently, said rigid pin will be slid into said central opening to maintain said flexible fastening fingers in said first outwardly expanded position whereby said cirojit board stiffener is secured to the circuit board.

7. The circuit board stiffener of claim 6 further comprising a compression bump formed on each of said at least two fingers to enhance engagement with the circuit board.

* * * * *